United States Patent
Ding et al.

(10) Patent No.: US 11,628,867 B2
(45) Date of Patent: Apr. 18, 2023

(54) MONITORING DEVICE FOR INTERNAL DEFORMATION AND FINE PARTICLE LOSS OF RAILWAY SUBGRADE

(71) Applicant: WENZHOU UNIVERSITY, Wenzhou (CN)

(72) Inventors: Guangya Ding, Wenzhou (CN); Lin Zhou, Wenzhou (CN); Wenfeng Zhang, Wenzhou (CN); Guohui Yuan, Wenzhou (CN); Xiaobing Li, Wenzhou (CN); Ying Cai, Wenzhou (CN)

(73) Assignee: WENZHOU UNIVERSITY, Zhejiang Province (CN)

( * ) Notice: Subject to any disclaimer, the term of this patent is extended or adjusted under 35 U.S.C. 154(b) by 0 days.

(21) Appl. No.: 17/327,827

(22) Filed: May 24, 2021

(65) Prior Publication Data
US 2022/0089201 A1    Mar. 24, 2022

(30) Foreign Application Priority Data

Sep. 22, 2020 (CN) .......................... 202010999728.5

(51) Int. Cl.
*B61K 9/08*    (2006.01)
*G01R 27/02*    (2006.01)

(52) U.S. Cl.
CPC ................ *B61K 9/08* (2013.01); *G01R 27/02* (2013.01)

(58) Field of Classification Search
CPC .................................. B61K 9/08; G01R 27/02
See application file for complete search history.

(56) References Cited

FOREIGN PATENT DOCUMENTS

| CN | 201083788 Y | * | 7/2008 | |
| CN | 209459692 U | * | 10/2019 | ........... G01L 1/2206 |
| CN | 209459692 U | | 10/2019 | |

OTHER PUBLICATIONS

Chinese First Office Action dated May 24, 2021 from corresponding Chinese Patent Application No. 202010999728.5, 8 pages.

* cited by examiner

*Primary Examiner* — Natalie Huls
*Assistant Examiner* — Sharad Timilsina
(74) *Attorney, Agent, or Firm* — Ohlandt, Greeley, Ruggiero and Perle, LLP

(57) ABSTRACT

The present disclosure discloses a monitoring device for internal deformation and fine particle loss of a railway subgrade, relating to the field of monitoring devices. The monitoring device includes an internal damage monitoring device arranged in a subgrade ballast layer. The internal damage monitoring device is connected to a resistance acquisition instrument through a wire. The resistance acquisition instrument is in wireless connection with a resistance signal receiver. The monitoring device for internal deformation and fine particle loss of a railway subgrade provided by the present disclosure can remotely realize real-time continuous monitoring of the deformation and fine particle loss inside the railway subgrade under a rail transit load, is economical and convenient, and has high practice value.

4 Claims, 4 Drawing Sheets

MONITORING DEVICE FOR INTERNAL DEFORMATION AND FINE PARTICLE LOSS OF RAILWAY SUBGRADE

CROSS REFERENCE TO RELATED APPLICATION(S)

This patent application claims the benefit and priority of Chinese Patent Application No. 202010999728.5, filed on Sep. 22, 2020, the disclosure of which is incorporated by reference herein in its entirety as part of the present application.

TECHNICAL FIELD

The present disclosure relates to the technical field of monitoring equipment, and in particular, to a monitoring device for internal deformation and fine particle loss of a railway subgrade.

BACKGROUND ART

In recent years, with rapid development of rail transit, both train traveling speed and axle load are constantly increasing. This greatly increases the burden of a railway subgrade, so that the deformation amount of the railway subgrade is more than expected, which not only affects normal traveling of a train during operation, but also increases late reinforcement and maintenance cost of the subgrade. Meanwhile, fine particles in the subgrade are scoured with the seepage of rainwater, which greatly affects the stability of the subgrade under a rail transit load. Therefore, late investment cost can be effectively reduced by monitoring the internal deformation and the loss rate of the internal fine particles of the railway subgrade timely and reinforcing when the railway subgrade produces a certain amount of deformation. However, monitoring means nowadays are mainly subgrade surface settlement monitoring. There are few monitoring means for internal deformation of the subgrade, and the existing monitoring means have certain hysteresis, all of which are the monitoring of long-term accumulated deformation of the subgrade. However, there are few means for monitoring the deformation of filling soil inside the subgrade below a train during its traveling period and monitoring the stress transfer inside the subgrade. On the other hand, the existing subgrade deformation monitoring is mostly on-site monitoring, and is mostly the monitoring at different time points, so, it is very difficult to realize continuous monitoring. Therefore, it is difficult to monitor the situation that the internal deformation of the subgrade increases suddenly, which will bring great potential safety hazard to safety traveling of the train. However, there is hardly monitoring means for the loss rate of the internal fine particles of the subgrade, which brings great potential hazard to safety traveling of the train.

SUMMARY

The objective of the present disclosure is to provide a monitoring device for internal deformation and fine particle loss for a railway subgrade for solving the above-mentioned problems in the prior art, which can remotely realize real-time continuous monitoring of the deformation and fine particle loss inside the railway subgrade under a rail transit load, is economical and convenient, and has high practice value.

To achieve the above objective, the present disclosure provides the following solutions:

The present disclosure provides a monitoring device for internal deformation and fine particle loss of a railway subgrade, including an internal damage monitoring device arranged in a subgrade ballast layer. The internal damage monitoring device is connected to a resistance acquisition instrument through a wire. The resistance acquisition instrument is in wireless connection with a resistance signal receiver.

Optionally, the internal damage monitoring device includes two loading plates that are symmetrically arranged up and down. A geomembrane bag is connected between the two loading plates. A monitoring device is arranged in the geomembrane bag. The monitoring device includes multiple intelligent conductive coarse particles that are arranged in a superposed manner in sequence. A gap between two adjacent intelligent conductive coarse particles is filled with fine sand. Multiple measurement points are arranged on the monitoring device. Conductive adhesive tapes are arranged at the positions of the measurement points. The conductive adhesive tapes are connected to the intelligent conductive coarse particles located at the measurement points. The conductive adhesive tapes are connected to the resistance acquisition instrument.

Optionally, the intelligent conductive coarse particles are of spherical structures, including crushed stones. The crushed stones are externally coated with a conductive mixture. The conductive mixture includes rubber, high-density polyethylene, carbon black, and graphene that are mixed in a molten state.

Optionally, the rubber, the high-density polyethylene, the carbon black, and the graphene in the conductive mixture are in the mass ratio of 20%:20%:50%:10%.

Optionally, seven layers of conductive adhesive tapes in total are arranged on the monitoring device from bottom to top. The distance between two adjacent conductive adhesive tapes from the first layer and the sixth layer from bottom to top is 20 cm. The distance between the conductive adhesive tape of the sixth layer and the conductive adhesive tape of the seventh layer is 25 cm.

Compared with the prior art, the present disclosure achieves the following technical effects:

The intelligent conductive coarse particles of the present disclosure not only reduce the wear among particles under a train load, and also achieve the effects of isolating vibration and reducing vibration. A conductive network is formed among the intelligent conductive coarse particles, which can monitor the internal deformation amount of the railway subgrade, and solves the problem of the lack of monitoring means for the internal deformation of the subgrade nowadays. The intelligent conductive coarse particles can effectively monitor the internal fine particle loss of the subgrade under the seepage of rainwater, which compensates the lack of the monitoring means for the internal fine particle loss of the subgrade at the present stage. The intelligent conductive particles, the resistance acquisition instrument, and the resistance signal receiver are combined reasonably, which realizes real-time monitoring of the internal deformation amount of the railway subgrade under the rail transit load, and solves the problems that the internal deformation amount and the stress transfer of the subgrade are difficult to monitor when a train travels. Sensors do not need to be arranged manually on site, which reduces late monitoring cost, is economical and convenient, and has high practical value.

BRIEF DESCRIPTION OF THE DRAWINGS

To describe the technical solutions in the embodiments of the present disclosure or in the prior art more clearly, the following briefly describes the accompanying drawings required for describing the embodiments. Apparently, the accompanying drawings in the following description show merely some embodiments of the present disclosure, and those of ordinary skill in the art may still derive other drawings from these accompanying drawings without creative efforts.

Figure 1:
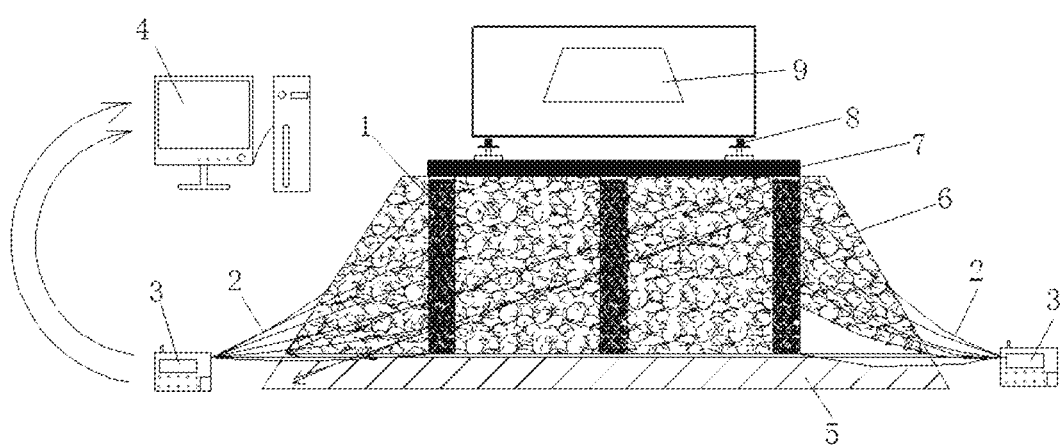
FIG. 1 is a layout diagram of an overall structure of the present disclosure.

Reference signs in drawings: 1—internal damage monitoring device; 101—geomembrane bag; 102—intelligent conductive coarse particle; 1021—crushed stone; 1022—conductive mixture; 103—conductive adhesive tape; 104—sand; 105—loading plate; 2—wire; 3—resistance acquisition instrument; 4—resistance signal receiver; 5—subgrade; 6—ballast layer; 7—sleeper; 8—rail; 9—train; 10—long steel strip; 11—mold.

DETAILED DESCRIPTION OF THE EMBODIMENTS

The technical solutions in the embodiments of the present disclosure will be clearly and completely described herein below with reference to the accompanying drawings in the embodiments of the present disclosure. Apparently, the described embodiments are merely part rather than all of the embodiments of the present disclosure. On the basis of the embodiments of the present disclosure, all other embodiments obtained by those of ordinary skill in the art without creative work fall within the protection scope of the present disclosure.

The objective of the present disclosure is to provide a monitoring device for internal deformation and fine particle loss of a railway subgrade for solving the above-mentioned problems in the prior art, which can remotely realize real-time continuous monitoring of the deformation and fine particle loss inside the railway subgrade under a rail transit load, is economical and convenient, and has high practice value.

In order to make the above objective, features, and advantages of the present disclosure more apparent and more comprehensible, the present disclosure is further described in detail below with reference to the accompanying drawings and specific implementation manners.

The present disclosure provides a monitoring device for internal deformation and fine particle loss of a railway subgrade. Principle: a novel internal damage monitoring device is placed inside the railway subgrade. Under the rail transit load, the subgrade will inevitably produce certain deformation, and the internal damage monitoring device will also produce corresponding deformation along with it. The internal damage monitoring device consists of novel intelligent conductive coarse particles, which are made of the material consistent with that of a subgrade body, so as not to change the original structure of the subgrade and the overall mechanical properties of the subgrade, and meanwhile, have the characteristics of vibration isolation, vibration reduction, and electricity conductivity. The real-time deformation situation inside the railway subgrade is reflected by monitoring the resistance at different positions of the internal damage monitoring device in real time. On the other hand, fine particles in a ballast are extremely easily scoured out from the interior of the subgrade with the seepage of rainwater, which changes the gradation of filling materials of the subgrade and produces adverse effect on its long-term stability under the rail transit load. The internal damage monitoring device can effectively monitor the loss rate of the internal fine particles of the subgrade through the change of the resistance. The overall monitoring system can not only realize real-time monitoring on the internal deformation of the subgrade under the rail transit load, but also perform effective monitoring on the loss rate of the internal fine particles of the subgrade under the seepage of rainwater, which is economical and convenient, and has high practical value.

Specifically, the monitoring device for internal deformation and fine particle loss of a railway subgrade provided by the present disclosure is as shown in FIG. 1. The overall monitoring system mainly includes four parts of an internal damage monitoring device 1, a wire 2, a resistance acquisition instrument 3, and a resistance signal receiver 4. The internal damage monitoring device 1 is placed in a ballast layer 6 of a subgrade 5. Sleepers 7 and rails 8 are arranged above the ballast layer 6. A train 9 travels on the rails 8. The internal damage monitoring device 1 is connected to the external resistance acquisition instrument 3 through the wire 2. The resistance acquisition instrument 3 transmits a received resistance signal to the resistance signal receiver 4. Real-time continuous remote monitoring of the internal deformation of the subgrade 5 of a railway is realized by performing secondary analyzing and processing on the resistance signals at different positions of the internal damage monitoring device 1.

Figure 2:
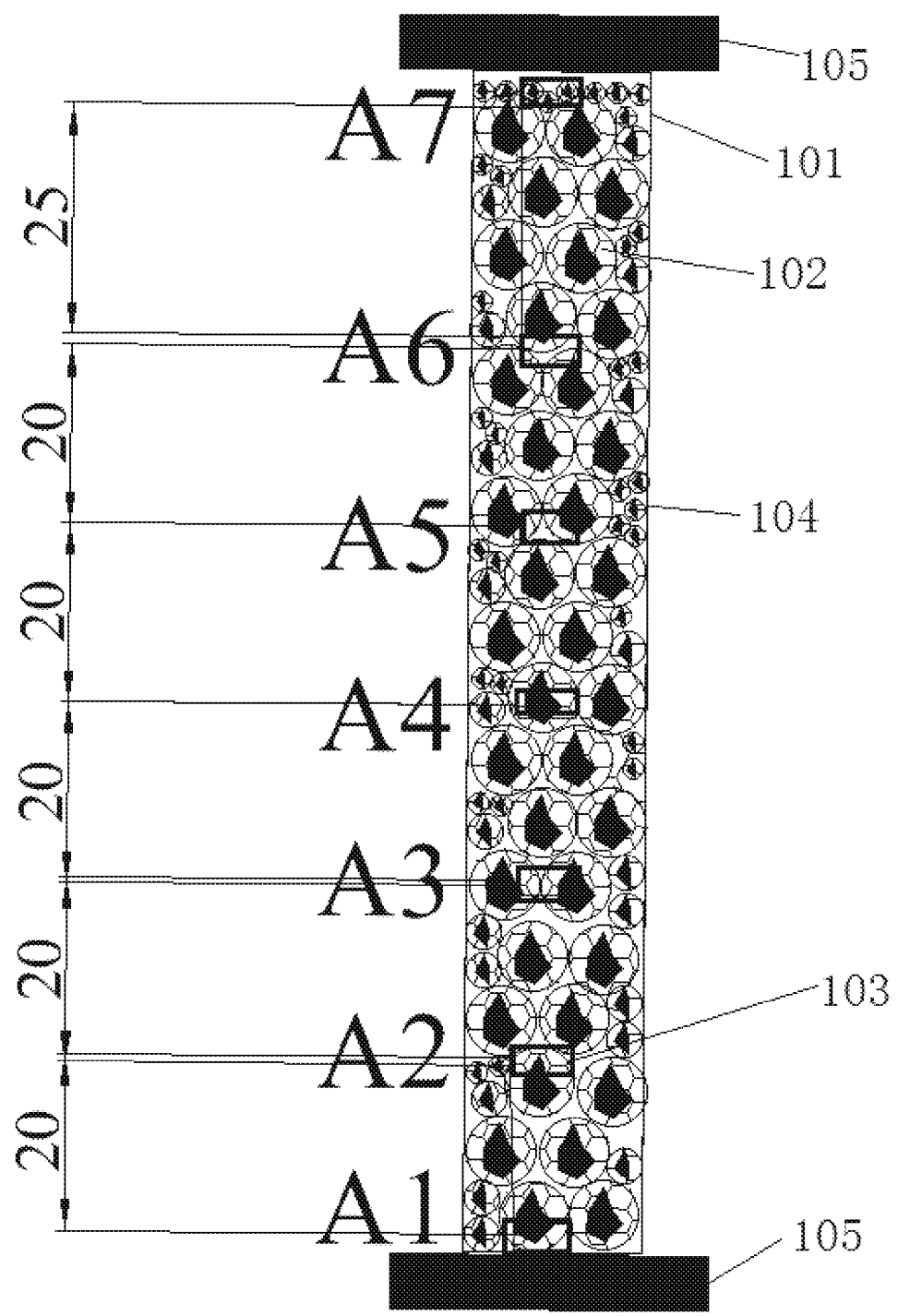
FIG. 2 is a schematic structural diagram of an internal damage monitoring device of the present disclosure.

FIG. 2 shows a specific structural diagram of the internal damage monitoring device 1. It can be seen from the figure that the internal damage monitoring device 1 mainly includes two loading plates 105, a geomembrane bag 101 located between the two loading plates 105, intelligent conductive coarse particles 102, conductive adhesive tapes 103, and sand 104. The conductive adhesive tapes 103 are connected to the external resistance acquisition instrument 3 through the wire 2, so as to realize the monitoring of a resistance change situation between different positions of the internal monitoring device under the rail transit load. The monitoring device is provided with seven measurement points in total from bottom to top. A layer of conductive adhesive tape 103 is arranged at each measurement point. The distance between two adjacent conductive adhesive tapes 103 at the measurement points A1 to A6 is 20 cm. The distance between two adjacent conductive adhesive tapes 103 at the measurement points A6 to A7 is 25 cm. Before the internal damage monitoring device 1 is placed, the internal damage monitoring device 1 needs to be calibrated. The calibration is completed by using a uniaxial compression test. Specific calibration steps are as follows:

(1) The internal damage monitoring device 1 is placed on a uniaxial compression instrument and is fixed.

(2) The test adopts strain control. The uniaxial compression test is performed on the internal damage monitoring device 1. Five groups of different strain values are considered in single loading, which are 1%, 2%, 3%, 4% and 5% respectively. The loading time of each group of strain is 5 minutes. The resistance is measured and recorded through the resistance acquisition instrument after the resistance value of the internal damage monitoring device is stable.

Figure 3:
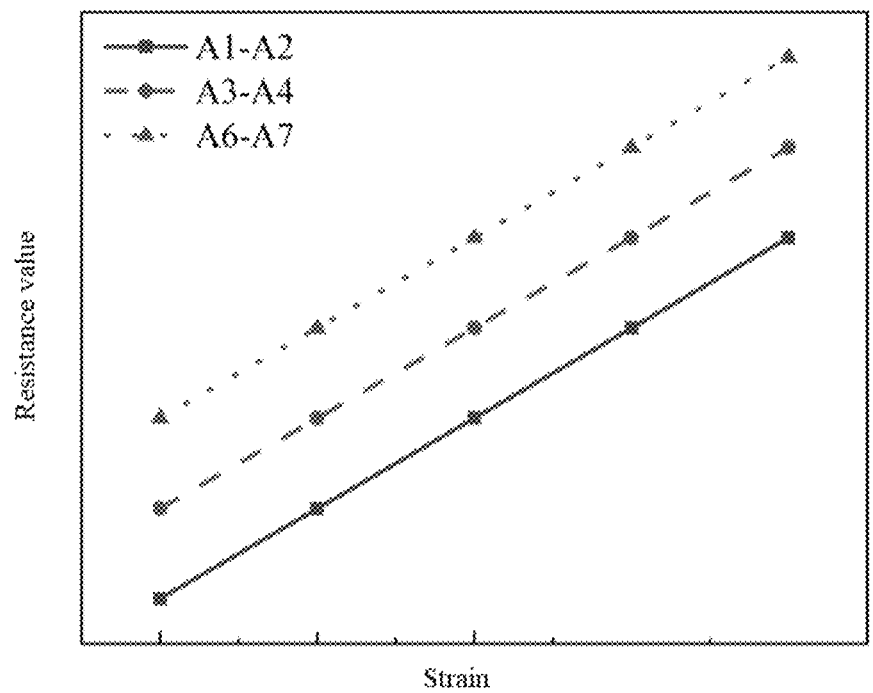
FIG. 3 is a strain-resistance relationship curve at different positions of the internal damage monitoring device of the present disclosure.

(3) A strain-resistance relationship curve at different positions of the internal damage monitoring device under different strain values is drawn, and a relationship model between strain and resistance is established, as shown in FIG. 3. With the increase of strain, the damage of the intelligent conductive coarse particles 102 in the internal damage monitoring device 1 is aggravated. The overall conductive network is damaged. The resistance value of the internal damage monitoring device increases gradually. The resistance value of the upper part of the internal damage monitoring device is significantly greater than that of a lower end, which indicates that the strain of the upper part of the subgrade is greater, and it is consistent with the actual situation. It is proved that it is feasible to monitor the deformation amount of the subgrade under the rail transit load by the resistance values between the intelligent coarse particles.

Figure 4:
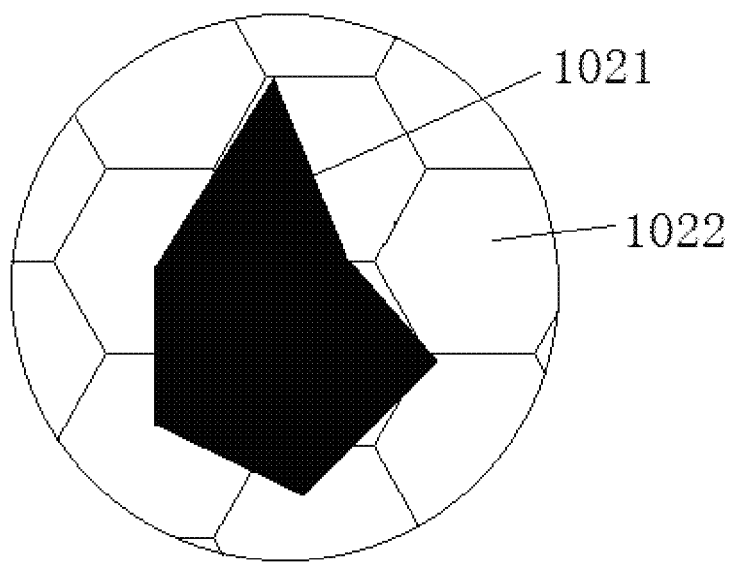
FIG. 4 is a schematic structural diagram of intelligent conductive coarse particles of the present disclosure.

FIG. 4 shows a schematic structural diagram of the intelligent conductive coarse particle 102 developed by the present disclosure. It can be seen from the figure that the intelligent conductive coarse particles 102 mainly include common crushed stones 1021 and a conductive mixture 1022. The conductive mixture 1022 includes rubber, high-density polyethylene, carbon black, and graphene that are mixed in a molten state. The rubber, the high-density polyethylene, the carbon black, and the graphene in the conductive mixture are in the mass ratio of 20%:20%:50%:10%. The mixture not only has certain elasticity, which can reduce the wear among the coarse particles, but also has good electricity conductivity due to the existence of the carbon black and the graphene. An overall conductive network is formed inside the monitoring device through the contact among the particles. When the particles are damaged due to deformation, the conductive network is gradually damaged, and the resistance values among the intelligent coarse particles increase gradually. This characteristic makes it suitable for monitoring the internal deformation of the railway subgrade. When the internal fine particles inside the subgrade are brought out from the interior of the subgrade along with the seepage of rainwater, the contact areas among the intelligent coarse particles increase gradually, so that the resistance value of the overall conductive network decreases gradually. This characteristic makes it suitable for monitoring the loss rate of the internal fine particles of the subgrade. Specific manufacturing steps of the intelligent conductive coarse particles are as follows:

(1) Corresponding masses of the rubber, the high-density polyethylene, the carbon black, and the graphene are weighed according to a designed mass ratio.

(2) The four materials are respectively placed into a barrel in batches and are stirred manually. After the materials are primarily stirred uniformly, the materials are poured into a stirring machine and are stirred for 30 minutes. After the mixture is mixed fully and uniformly, the mixture is heated in a heating furnace until it is heated into slurry.

(3) Common crushed stones are placed into a sphere model with the diameter of 8 cm, and grouting is performed through a hole reserved in the sphere model, where the grouted slurry is the slurry produced by heating in Step (2). Finally, cooling and forming are performed.

Figure 5:
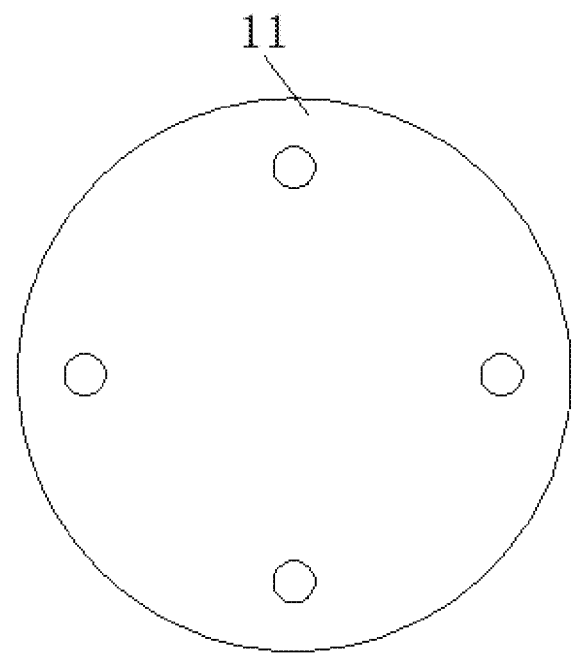
FIG. 5 is a schematic diagram of a manufacturing mold for the intelligent conductive coarse particles of the present disclosure.
Figure 6:
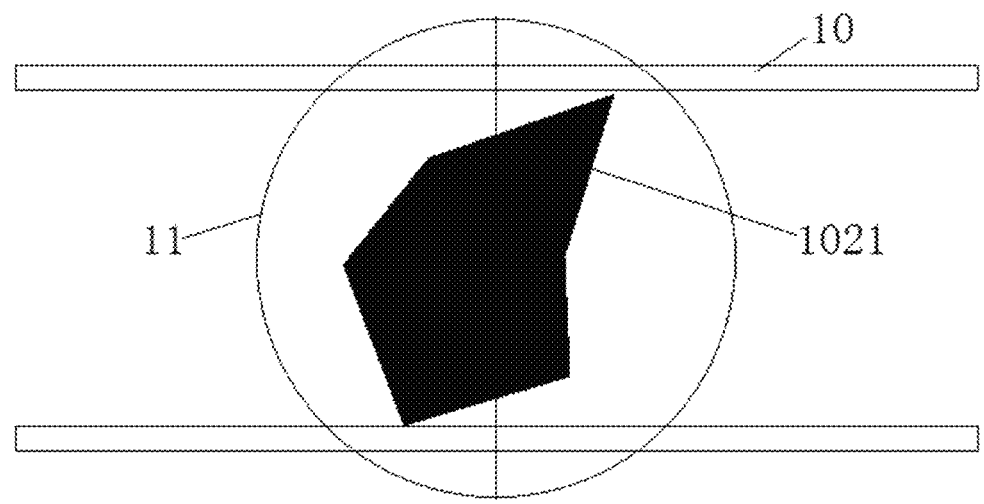
FIG. 6 is a layout diagram of the intelligent conductive coarse particles in the mold of the present disclosure.

In order to ensure good electricity conductivity of the intelligent conductive coarse particles, the crushed stones are placed among the intelligent particles, so that the crushed stones are completely coated by a conductive material. Therefore, a special manufacturing mold is designed, as shown in FIG. 5. The mold 11 consists of two hemispheres. The sphere is hollow, and the thickness is 5 mm. Four holes are formed in each hemisphere. A specific layout form of the holes are as shown in FIG. 5. The crushed stones 1021 in the mold are fixed by penetrating long steel strips 10 through the holes in the hemispheres, so that the crushed stones 1021 are located in the center of the mold, and are completely coated by the conductive mixture 1022, thereby ensuring good electricity conductivity of the intelligent conductive coarse particles. A layer of Vaseline is smeared on the long steel strips before the long steel strips are inserted, so as to facilitate withdrawing of the long steel strips 10 after grouting and condensing are completed. A specific layout diagram of the crushed stones 1021 in the mold 11 is as shown in FIG. 6.

In the present disclosure, specific examples are applied to illustrate the principle and implementation manner of the present disclosure. The description of the above embodiments is only used to help understand the method and core idea of the present disclosure. Meanwhile, for those of ordinary skill in the art, there will be changes in the specific implementation manner and scope of application according to the idea of the present disclosure. In conclusion, the content of the present description shall not be construed as a limitation to the present disclosure.

What is claimed is:

1. A monitoring device for internal deformation and fine particle loss of a railway subgrade, comprising an internal damage monitoring device arranged in a subgrade ballast layer, wherein the internal damage monitoring device is connected to a resistance acquisition instrument through a wire; the resistance acquisition instrument is in wireless connection with a resistance signal receiver,
wherein the internal damage monitoring device comprises two loading plates that are symmetrically arranged up and down; a geomembrane bag is connected between the two loading plates; a monitoring device is arranged in the geomembrane bag; the monitoring device comprises multiple intelligent conductive coarse particles that are arranged in a superposed manner in sequence; a gap between two adjacent intelligent conductive coarse particles is filled with fine sand; multiple measurement points are arranged on the monitoring device; conductive adhesive tapes are arranged at the positions of the measurement points; the conductive adhesive tapes are connected to the intelligent conductive coarse particles located at the measurement points; the conductive adhesive tapes are connected to the resistance acquisition instrument.

2. The monitoring device for internal deformation and fine particle loss of a railway subgrade according to claim 1, wherein the intelligent conductive coarse particles are of spherical structures, comprising crushed stones; the crushed stones are externally coated with a conductive mixture; the mixture comprises rubber, high-density polyethylene, carbon black, and graphene that are mixed in a molten state.

3. The monitoring device for internal deformation and fine particle loss of a railway subgrade according to claim 2, wherein the rubber, the high-density polyethylene, the carbon black, and the graphene in the conductive mixture are in the mass ratio of 20%:20%:50%:10%.

4. The monitoring device for internal deformation and fine particle loss of a railway subgrade according to claim 1, wherein seven layers of conductive adhesive tapes in total are arranged on the monitoring device from bottom to top; the distance between two adjacent conductive adhesive tapes between from the first layer and the sixth layer from bottom to top is 20 cm; the distance between the sixth layer of the conductive adhesive tape and the seventh layer of the conductive adhesive tape is 25 cm.

* * * * *